United States Patent
Kim et al.

(10) Patent No.: US 11,338,578 B2
(45) Date of Patent: May 24, 2022

(54) DROPLET INSPECTION MODULE AND DROPLET INSPECTION METHOD

(71) Applicant: SEMES CO., LTD., Chungcheongnam-do (KR)

(72) Inventors: Kwangsup Kim, Chungcheongnam-do (KR); Dongok Ahn, Gyeonggi-do (KR); Junho Oh, Gyeonggi-do (KR); Ji Hoon Yoo, Daegu (KR); Myeong Jun Lim, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 50 days.

(21) Appl. No.: 17/079,029

(22) Filed: Oct. 23, 2020

(65) Prior Publication Data

US 2021/0122154 A1    Apr. 29, 2021

(30) Foreign Application Priority Data

Oct. 23, 2019    (KR) .................... 10-2019-0132223

(51) Int. Cl.
*B41J 2/045*    (2006.01)

(52) U.S. Cl.
CPC ....... *B41J 2/04561* (2013.01); *B41J 2/04586* (2013.01)

(58) Field of Classification Search
CPC .. B41J 2/0456; B41J 2/04581; B41J 2/04561; B41J 2/04586
See application file for complete search history.

(56) References Cited

U.S. PATENT DOCUMENTS

2015/0177136 A1* 6/2015 Andoh .................. G01N 21/47
356/343

FOREIGN PATENT DOCUMENTS

| JP | 2009-72691 A | 4/2009 |
|---|---|---|
| JP | 2014-197653 A | 10/2014 |
| KR | 10-2006-0091495 A | 8/2006 |
| KR | 10-2009-0110176 A | 10/2009 |
| KR | 10-2010-0125091 A | 11/2010 |
| KR | 10-2012-0067070 A | 6/2012 |
| KR | 20120067070 A | 6/2012 |
| KR | 10-2015-0039014 A | 4/2015 |
| KR | 20180083529 A | 7/2018 |

* cited by examiner

*Primary Examiner* — Thinh H Nguyen
(74) *Attorney, Agent, or Firm* — Procopio, Cory, Hargreaves & Savitch LLP (57) ABSTRACT

An inspection module is disclosed for inspecting a droplet from an ink jet head. The inspection module includes a sensor located under the ink jet head and measuring a distance between the droplet and the sensor in real time; a variable lens changing an operating distance based on the measured distance of the sensor; and a camera for capturing an image of the droplet. The inspection module further includes a droplet inspecting part inspecting the droplet image captured by the camera.

10 Claims, 6 Drawing Sheets

DROPLET INSPECTION MODULE AND DROPLET INSPECTION METHOD

CROSS-REFERENCE TO RELATED APPLICATIONS

A claim for priority under 35 U.S.C. § 119 is made to Korean Patent Application No. 10-2019-0132223 filed on Oct. 23, 2019, in the Korean Intellectual Property Office, the entire contents of which are hereby incorporated by reference.

BACKGROUND

The present disclosure described herein relates to a droplet inspection module and a droplet inspection method, and more particularly, to a module and an inspection method for inspecting a droplet ejected from an ink jet head.

A printing apparatus having an ink jet head is used when printing is performed using ink on a print medium such as paper, when an alignment film is formed or a UV ink is applied on a substrate (transparent substrate) for manufacturing a liquid crystal display device or the like, or when a color filter is applied on a substrate for manufacturing an organic EL display device or the like.

In the process of using the ink jet head, it is inspected that a state of the droplet ejected from a plurality of nozzles provided to the ink jet head, more particularly, the presence or absence of the droplet ejected, and the amount of ejection of the droplet.

A camera is mainly used for inspecting the presence of the droplet ejected, and an electronic scale is used for inspecting the amount of the droplet ejected.

Figure 1:
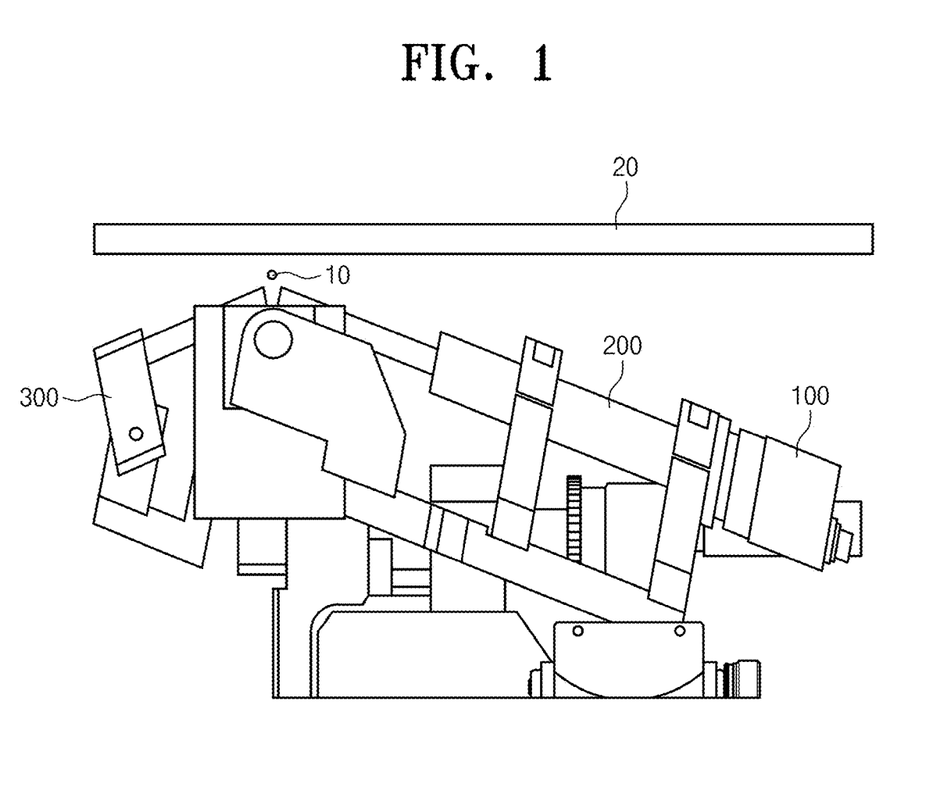
FIG. 1 shows a structure for inspecting the droplet ejected from a conventional ink jet head.

FIG. 1 shows the structure for inspecting the droplet 10 ejected from the existing ink jet head 20.

According to FIG. 1, a high-magnification lens 200 and a high-resolution camera 100 are required for inspecting the droplet 10 ejected from the ink jet head 20. However, hardware interference with the ink jet head 20 and smaller inspection area put a limit on constructing an optical system. For this reason, the lens 200 and an illumination part 300 form a curve.

In addition, the measuring area for measuring the droplet 10 ejected from the ink jet head 20 is as small as 10 mm or less, so the high-magnification is required. But the high-magnification may not accurately measure the droplet drop falling from the ink jet head due to its low depth of focus.

In addition, because the lens 200 and the illumination part 300 form the curve in the optical system, a problem associated with the lens 200 aperture and operating distance may occur. When the lens 200 and the illumination part 300 form the curve in the optical system the lens will highly likely be out of focus, and a set-up level and operating time may increase.

Figure 2A:
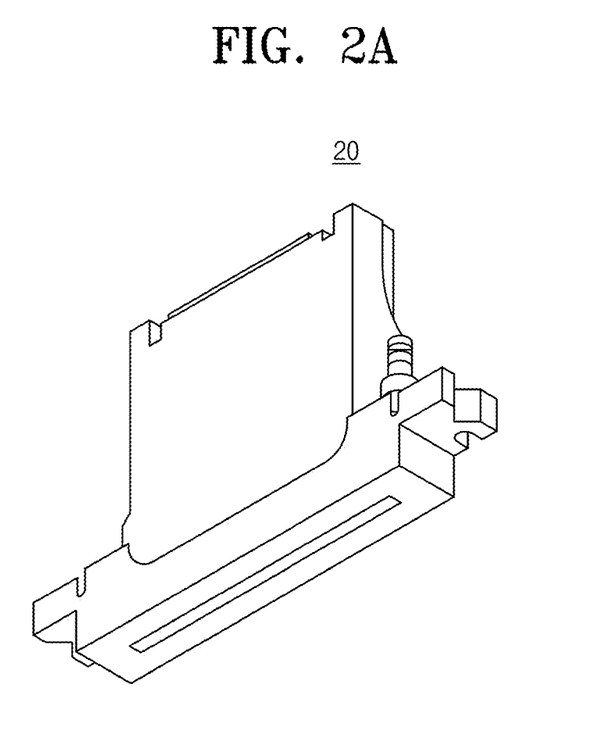
FIGS. 2A and 2B shows the ink jet head.
Figure 2B:
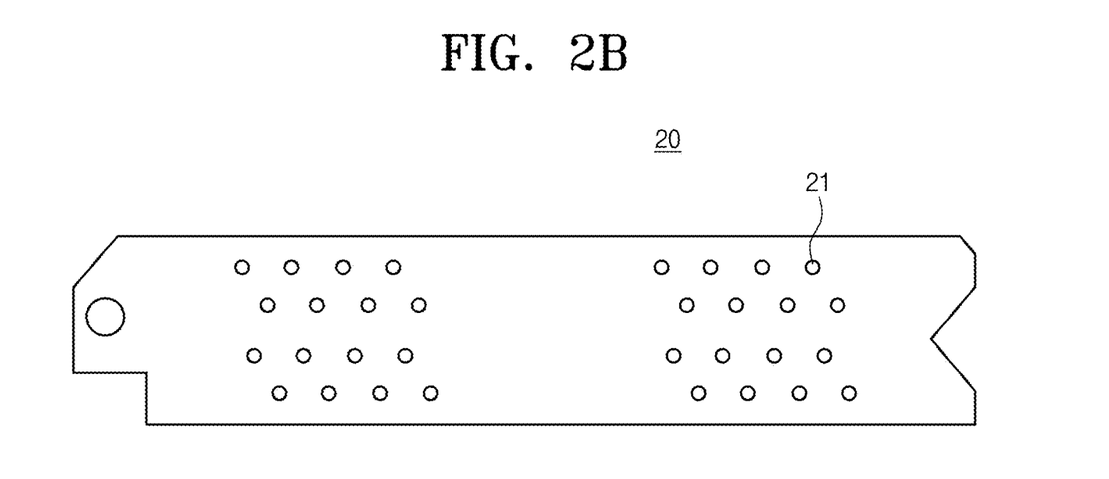

According to FIG. 2, one exemplary embodiment of the ink jet head 20 is shown. According to the example of FIG. 2, one head 20 includes a plurality of nozzles 21, and thus a plurality of nozzles needs to be inspected. According to the example, one head includes 1024 nozzles and about 70 heads or more, and all of nozzles need to be inspected.

The inspection of a plurality of nozzles needs time to move for inspecting the droplet 10 ejected from the ink jet head 20. In conventional arts, only 4 nozzles are inspected and thus the inspection apparatus should move 64 times to inspect all nozzles, which causes Tact Time Loss and poor image quality.

SUMMARY

Embodiments of the present disclosure provide droplet inspecting module without hardware interference therewith.

Embodiments of the present disclosure provide the inspecting module that will clearly determine a droplet ejected from ink jet head.

Aspects of the present disclosure are not limited thereto, and other aspects as not mentioned will be clearly understood by those skilled in the art from description of embodiments and the accompanying drawings.

The inspecting module is disclosed for inspecting the droplet ejected from the ink jet head.

The inspecting module may comprise: a sensor located under the ink jet head and measuring a distance between the droplet and the sensor in real time; a variable lens changing an operating distance based on the measuring distance; and a camera for capturing an image the droplet.

The inspecting module may further comprise an inspecting part inspecting the droplet captured by the camera.

The sensor may be a TOF (Time of Flight) sensor.

The variable lens may be disposed outside of an area interfering with the ink jet head.

The area interfering with the ink jet head may locate under the ink jet head of which inks are ejected.

The inspecting module may further comprise an illumination part.

The illumination part may include a white light telecentric illumination.

The illumination part may include a RGB light source.

The droplet inspecting part may obtain and inspect the image of the droplet by wavelength band using the RGB light source.

The droplet inspecting part may perform an image processing by classifying according to a color of the droplet ejected from the ink jet head.

According to another example of the present disclosure, the method is disclosed for inspecting the droplet ejected from the ink jet head.

The method may comprise: measuring a distance for the droplet ejected in real time; and changing the operating distance of the lens according to the measuring the distance; and capturing the image of the droplet using the camera.

The method measuring the distance in real time may use the TOF sensor.

The method changing the operating distance of the lens may use the variable lens disposed at outside of the area interfering with the ink jet head.

The method may comprise performing the droplet inspection using the captured droplet.

The method may further include applying the RGB illumination to the droplet ejected from the ink jet head.

The method may further comprise performing the inspection by classifying the color of the droplet applied the illumination.

The method may further comprise performing the inspection by obtaining the image by wavelength band of the droplet applied the illumination.

The embodiment of the present disclosure is disclosed for inspecting module that will perform the inspection of the droplet ejected from the ink jet head.

The embodiment of the present disclosure will clearly determine the droplet ejected from the ink jet head.

According to the embodiment of the present disclosure, the optical system will be constructed with no hardware interference.

According to the embodiment of the present disclosure, the installation of the inspecting module is easier than the conventional thereof.

The effect of the present disclosure is not limited to the above-described effect, and the effect not mentioned may be clearly understood by those of ordinary skill in the art from the present specification and the accompanying drawings.

DETAILED DESCRIPTION

The present disclosure and methods of accomplishing the same may be further understood by reference to the following detailed description of embodiments and the accompanying drawings. However, the present disclosure may be embodied in many different forms, and should not be construed as being limited to the embodiments set forth herein. Rather, these embodiments are provided so that this disclosure will be thorough and complete and will fully convey the concept of the invention to those skilled in the art, and the present disclosure will only be defined by the appended claims Unless defined otherwise, all terms used herein, including technical or scientific terms, have the same meaning as commonly understood by one of ordinary skill in the art to which this invention belongs. Terms such as those defined in commonly used dictionaries should be interpreted as having a meaning that is consistent with their meaning in the context of the relevant art and are not to be interpreted in an idealized or overly formal sense unless expressly so defined herein.

The term used herein describes the embodiment of the present disclosure and not be limited to the present disclosure. As used herein, the singular forms "a", "an", and "the" are intended to include plural referents as well, unless the context clearly indicates otherwise. It will be further understood that the terms "comprise" and/or various conjugational forms of this verb, such as "comprisal", "comprising", "comprised", do not preclude the presence or addition of one or more other constructions, components, elements, steps, actions. The term "and/or" in this description refers to each of the configuration or to various combinations thereof.

The terms first, second, etc. may be used to describe various elements, but the elements should not be limited by these terms. These terms are only used to distinguish one element from another. For example, without deviating from the rights of this disclosure, the first element may be named by the second element, and similarly the second element may be named the first element.

The singular forms "a", "an" and "the" include plural referents unless the context clearly dictates otherwise. For simplicity and clarity of illustration, elements in the figures are not necessarily drawn to scale. In addition, the shape and size of elements in the figures can be exaggerated for more clearly explanation.

The term used herein "part", which processes at least one function or operation, for example, may mean software elements and hardware elements such as FPGA, or ASIC. However, "part" does not be limited by software or hardware. "Part" may be composed of an addressable storage medium, or one or more processors running thereof.

According to one exemplary embodiment of the present disclosure, "part" may include elements such as software elements, object-oriented software elements, class elements, and processes, functions, attributes, procedures, sub-routines, segments of program codes, drivers, firmware, microcode, circuits, data, databases, data structure, tables, arrays, and variables. Functions from elements and "part" may be separately performed by the plurality of elements and "part", or be combined with additional elements.

FIG. 1 shows one example of a system for inspecting a droplet 10 ejected from a conventional ink jet head 20.

In the system inspecting the droplet 10 ejected from the conventional ink jet head 20, a vision system is used to inspect the volume, velocity, and angle of the ink ejected at the lower end of the ink jet head 20.

As mentioned in the BACKGROUND section, in the system for inspecting the droplet 10 ejected from the conventional ink jet head 20, there is a limitation of disposing the inspection system because of the ink jet construction.

FIG. 2a and FIG. 2b show the exemplary embodiments of the structure of the ink jet head 20.

The ink jet head 20 is used for forming an alignment layer or applying an UV ink on a substrate in manufacturing an LCD display or the like, and used for applying ink on a substate in manufacturing an organic EL displayer or the like.

One ink jet head 20 may have a plurality of nozzle 21.

According to FIG. 2, the number of nozzle 21 of the ink jet head 20 is plural.

In the embodiment of the present disclosure, when the droplet 10 ejected from the ink jet head 20 is inspected, the inspecting module and the method of inspection thereof is disclosed, which may remove the hardware interference at the lower end of the ink jet head 20.

Figure 3:
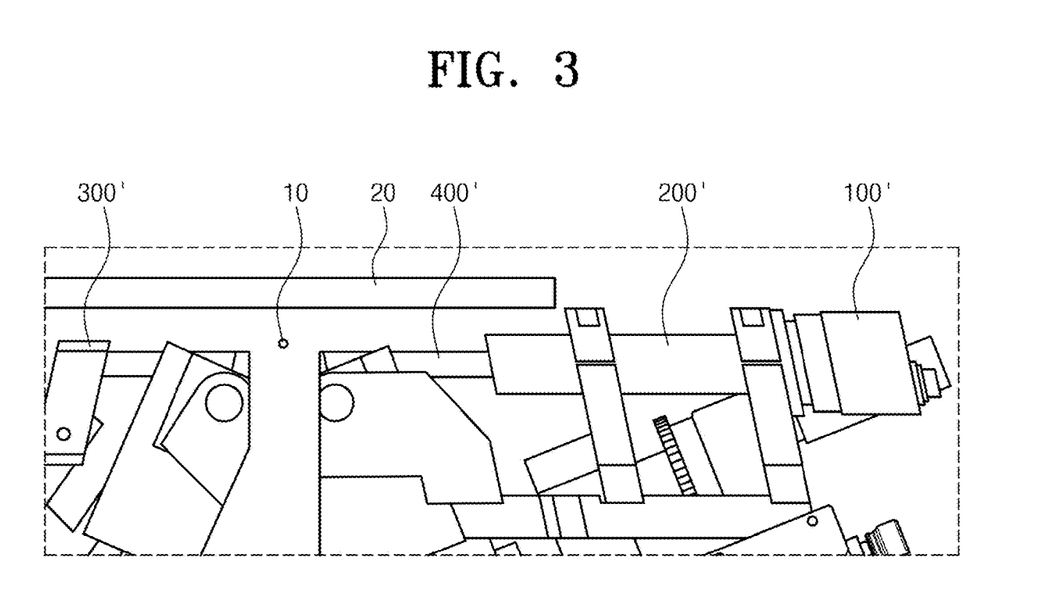
FIG. 3 shows a structure for inspecting the droplet ejected from the ink jet head according to an exemplary embodiment of the present disclosure.

In one example of the present disclosure, FIG. 3 shows the structure for inspecting the droplet 10 ejected from the ink jet head 20.

The difference of one example of FIG. 3 from the conventional facility of FIG. 1 is a sensor 400' is equipped and the optical system is provided without bending.

According to the example of FIG. 3, the droplet 10 ejected from the ink jet head 20 is detected at the same line of the sensor, so it is free to construct the optical system.

In addition, in the embodiment of the present disclosure, the distance of the falling droplet may be measured using the TOF sensor in real time. The detailed principle of TOF sensor will be described in FIG. 5 hereafter.

In the embodiment of the present disclosure, the inspection module may comprise an operating distance adjustable lens 200'. The operating distance adjustable lens 200' is suitably adjusted according to the distance between the TOF sensor and the ejected droplet. The operating distance adjustable lens 200' may be a liquid lens. The operating distance adjustable lens 200' may be referred as a variable lens 200' hereafter.

According to FIG. 3, the TOF sensor, the variable lens 200', and a camera 100' may be arranged in a line.

The TOF sensor may closely be disposed at the droplet 10 ejected, for determining the distance between the sensor and the droplet 10 ejected. The variable lens 200' may be disposed in a line with the TOF sensor for adjusting the operating distance using the distance between the sensor and the droplet 10 ejected.

In one exemplary embodiment of the FIG. 3, the optical system is constructed in a line using the variable lens 200'. And the variable lens 200' and the ink jet head 20 may be disposed with no interference. Therefore, the lens may not make hardware interference with the ink jet head 20.

According to the FIG. 3, the variable lens 200' is disposed of the area not interfering with the ink jet head 20. The variable lens 200' may be disposed outside of the area interfering with the ink jet head 20. The area interfering with ink jet head 20 is area under the ink jet head to which inks are ejected.

That is, as the variable lens 200' is disposed outside of the area under the ink jet head 20, the lens aperture(size) is irrelevant to the construction.

In the embodiment of the present disclosure, the operating distance may be variable, so the variable lens may be installed without the size of the lens aperture.

In the embodiment of the present disclosure, the operating distance may be adjusted through the variable lens 200', and then the depth of focus may be adjusted. Thus, the lens is out-focused, and set-up level and operating time will decrease.

In addition, because the high-resolution camera 100' may is used, FOD area may be expanded.

Figure 4:
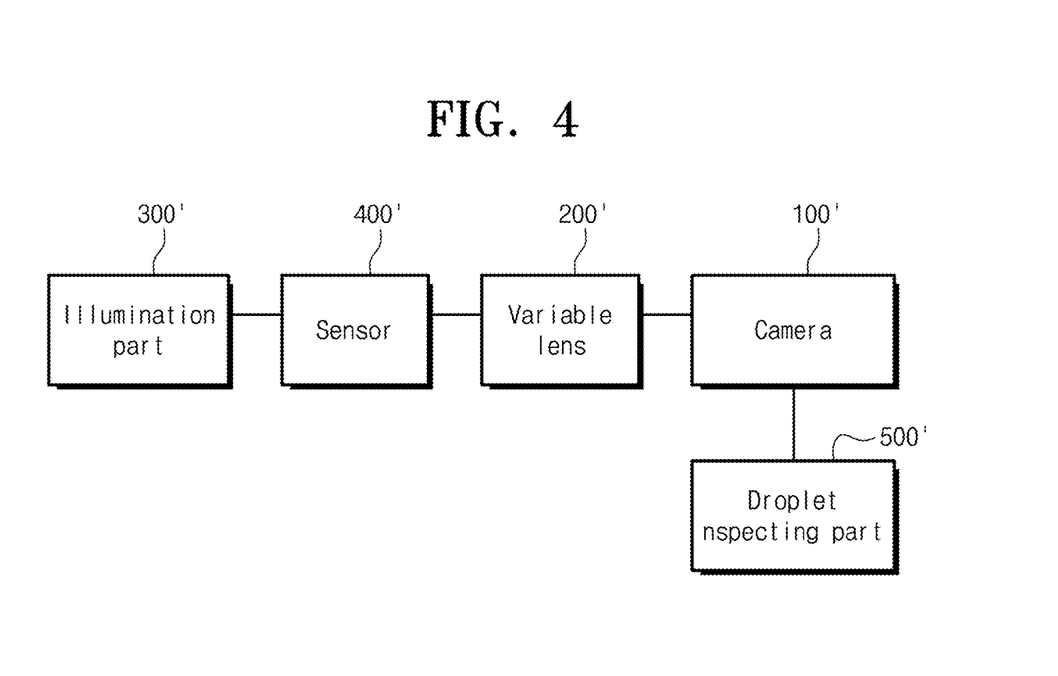
FIG. 4 is a block diagram showing the inspecting module according to an embodiment of the present disclosure.

FIG. 4 is a block diagram showing the inspection module according to the embodiment of the present disclosure.

According to the embodiment of the present disclosure, the inspection module may further comprise the sensor 400', the variable lens 200', the camera 100', a droplet inspecting part 500' and an illumination part 300'.

According to the embodiment of the present disclosure, the inspection module inspects the state of the droplet 10 ejected from the nozzle 21 of the ink jet head 20, more particularly, the presence or absence of droplet 10 ejected, and the amount of the ejection of droplet 10.

The sensor 400' of the inspecting module may sensor the presence of the droplet 10. The sensor 400' may sense the distance between the sensor and the droplet 10 ejected from the ink jet head, and transmit the distance to the variable lens 200'.

In one exemplary embodiment of the present disclosure, the sensor 400' may be a TOF sensor. The senor 400' uses the TOF sensor for calculating the distance between the sensor and the droplet 10 ejected in real time. The TOF sensor is disposed front end of the variable lens 200'. Other than the TOF sensor, the sensor 400' may use another sensor which calculates the distance between the sensor and the droplet 10 ejected in real time.

According to the embodiment of the present disclosure, the variable lens 200' may be a liquid lens. The variable lens 200' may adjust the operating distance by adjusting pressure applied at opposite ends thereof. The variable lens 200' may adjust the operating distance adjusting voltage applied at the variable lens 200'. The variable lens 200' uses the distance between the TOF sensor and the droplet 10 ejected for adjusting the operating distance for clearly detecting the droplet 10. This process may be repeated for each of the ejected droplet 10.

When the operating distance of the variable lens 200' is set up, the camera 100' captures an image of the droplet 10, and captured image is transmitted to the droplet inspecting part 500' for inspecting the droplet 10.

According to the embodiment of the present disclosure, the inspection module may further comprise the illumination part 300'. The illumination part 300' may illuminate the nozzle 21 of the ink jet head 20. In one example of the embodiment, the illumination part 300' may comprise an LED or a white light source. According to another example of the embodiment, the illumination part 300' may include an RGB light source.

According to the embodiment of the present disclosure, the illumination part 300' may illuminate the nozzle 21 of the ink jet head, and thus illuminate the droplet 10.

Or the illumination part 300' may illuminate the droplet 10 ejected from the ink jet head 20. As the illumination part 300' may light the droplet 10, the droplet inspecting part 500' may be inspected smoothly.

In one exemplary embodiment of the present disclosure, as illuminating the nozzle 21 of the ink jet head 20 using the RGB light source of the illumination part 300', the image of the droplet 10 may be captured per wavelength band. After that, characteristics of the image is classified separately by wavelength band. Also, merging characteristics of the image is possible.

In the embodiment of the present disclosure, the inspection using the RGB light may obtain an accurate image. Thus, the improvement of inspecting performance may be effective by capturing the image of each wavelength band. In addition, a 3D depth image can be captured, and additional inspection of the 3D depth image can be performed.

In the embodiment of the present disclosure, the distance between the sensor and the droplet 10 ejected from the ink jet head 20 is measured. And the inspection of the droplet 10 is easy to perform through adjusting the operating distance of the variable lens 200' using the measured distance. In this way, when the variable lens 200' captures the image of the droplet 10 by adjusting the operating distance, a location which is capable of making optimal focus may be calculated.

In still another exemplary present disclosure, detailed inspection of droplet 10 will be performed using various illumination part 300'. More particularly, images per wavelength band can be captured.

Figure 5:
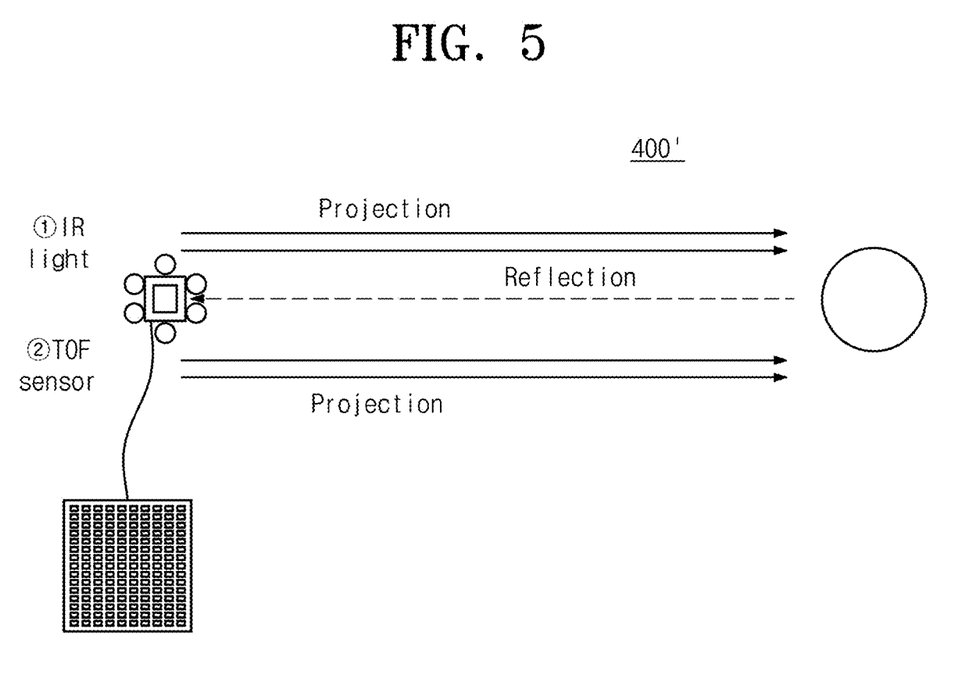
FIG. 5 describes a principle of the TOF sensor.

FIG. 5 describes the principle of the TOF sensor.

According to FIG. 5, the TOF sensor may be formed in arrays. The TOF sensor measures flight time of IR light, and flight time is convertible into the distance. Flight time may be the sum of projection time and reflection time.

In one exemplary embodiment of the present disclosure, a plurality of droplet 10 will be measured in real time using the array-formed TOF sensor.

The TOF sensor may print 3D depth information, and match information of depth with the colored 2D image in one for one. The TOF sensor operates at a high-speed of 150 sheets or more per second, and calculates the distance between the droplet 10 ejected and the sensor in real time. In addition, TOF sensors is mass-produced using the semiconductor process, which has the effect of price competitiveness through mass production. The TOF sensor does not occur textureless phenomenon because it is not the result from image processing. Therefore, unlike a stereo vision and a structured light, the TOF sensor may not occur inevitable errors in image processing. The noise of the TOF sensor caused by the change of light is low, so the TOF sensor can be used both day and night.

Figure 6:
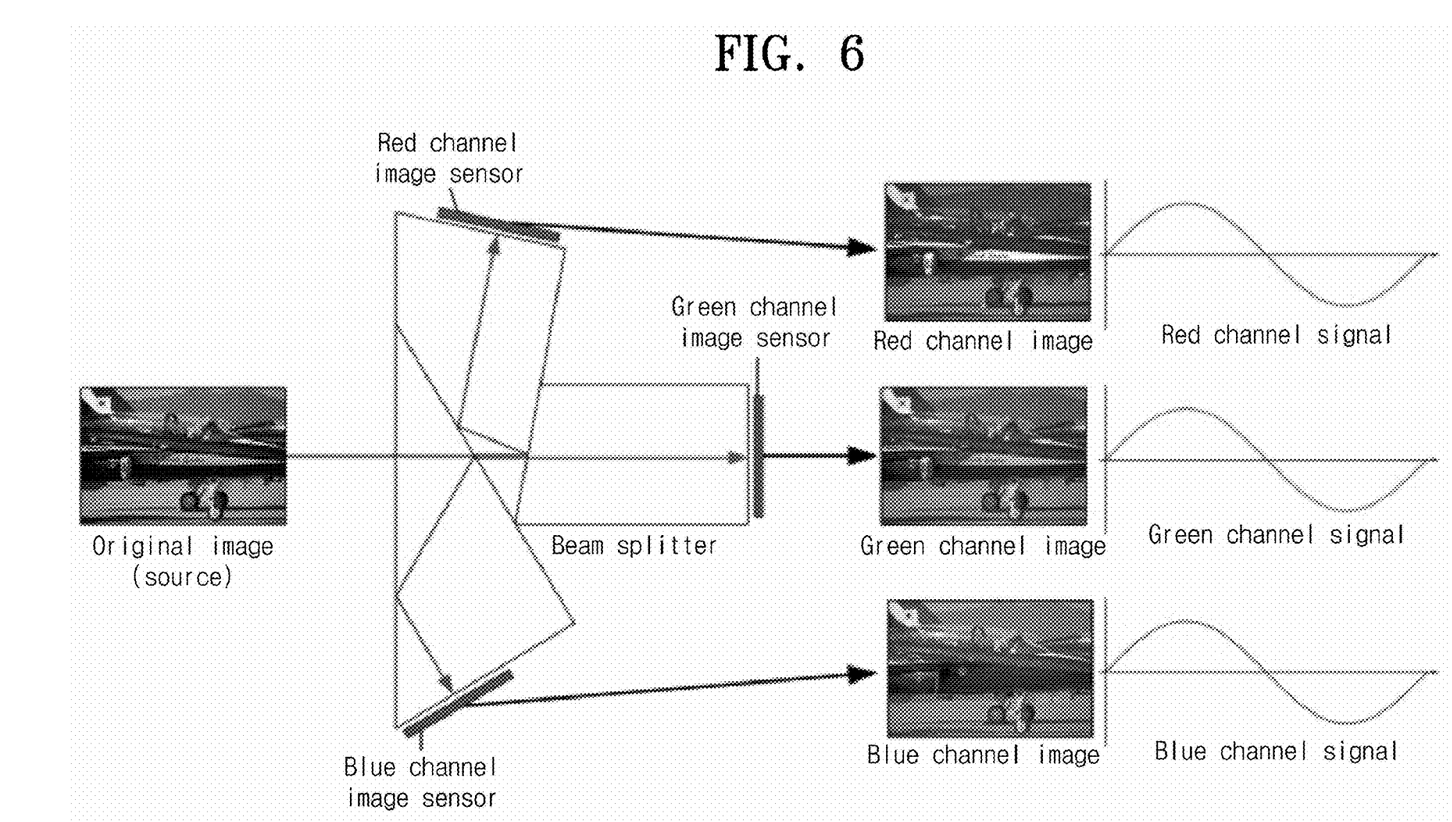
FIG. 6 describes a process of the illumination part.

FIG. 6 describes the process of the illumination part 300' in the embodiment of the present disclosure.

According to FIG. 6, the illumination part 300' comprise an RGB light source. The image of each wavelength band is sensed using each light source, therethrough signals of each wavelength band are extracted. Therefore, an optimized result of the image may be obtained.

In another example of the illumination part 300', white light telecentric illumination may be comprised. The telecentric illumination may prevent blur phenomenon at edge, and may detect an optimal outermost of the droplet 10 ejected.

Figure 7:
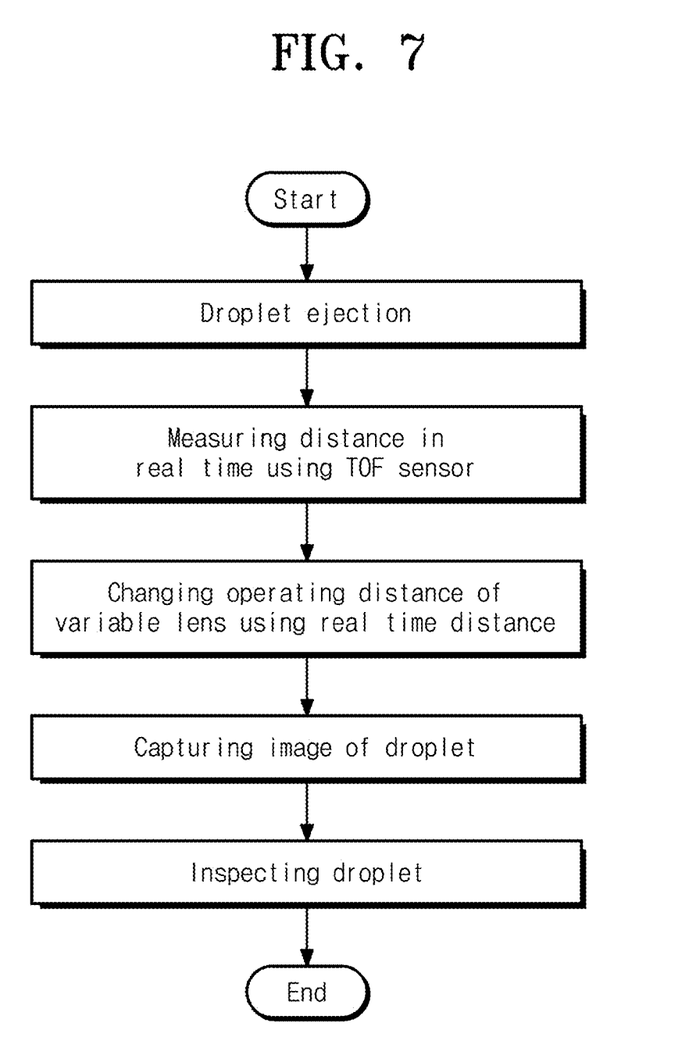
FIG. 7 is a flow chart showing the inspecting method according to an embodiment of the present disclosure.

FIG. 7 is a flowchart showing the method of the inspection.

According to FIG. 7, the droplet 10 is ejected from the nozzle 21 of the ink jet head 20. The ink jet head 20 comprises a plurality of the nozzles 21, droplets 10 are ejected from the plurality of the nozzles 21 simultaneously or consecutively. At this point, the nozzle 21 may be disposed in a line at constant pitch, and may eject the droplet 10 by the unit of gig.

When the droplet 10 ejected from the ink jet head 20, the TOF sensor will measure the distance between the droplet 10 and the sensor. The distance may be transmitted to the variable lens 200', and the operating distance of the variable lens 200' may be changed for focusing the droplet 10 measured by the TOF sensor.

When the operating distance is set up, the camera 100' captures the image, and the inspection of the droplet may be performed using the captured image.

In another exemplary embodiment of the present disclosure, the illumination may be applied to the nozzle 21 part of the ink jet head 20. The image is captured and classified by the color of the droplet 10 using the applied light. Therefore, more accurate image is processed.

The embodiment of the present disclosure provides the method for inspecting any droplet 10 with no hardware interference at area under the ink jet head 20. Therefore, the conventional limitation of hardware may be overcome, the blur image may be clearly captured and the accurate inspection of the droplet 10 is processed.

In addition, the operating distance adjustable lens 200' is used, therefore, the optical system is horizontally constructed.

In addition, the TOF sensor will inspect Focus In, and the operating distance will be adjusted automatically therethrough.

While the present disclosure has been described with what is presently considered to be exemplary embodiments, it is to be understood that the present disclosure is no limited to the disclosed embodiments, but, on the contrary, is intended to cover various modifications and equivalent arrangements included within the spirit and scope of the appended claims. Accordingly, the scope of the present disclosure shall be determined only according to the attached claims.

What is claimed is:

1. An inspecting module for inspecting a droplet ejected from an ink jet head, the inspecting module comprising:
 a sensor located under the ink jet head and measuring a distance between the droplet and the sensor in real time;
 a variable lens changing an operating distance based on the measured distance; and,
 a camera for capturing an image of the droplet.

2. The inspecting module according to claim 1, further comprising a droplet inspecting part for inspecting the droplet captured by the camera.

3. The inspecting module according to claim 2, wherein the sensor is TOF (Time of Flight) sensor.

4. The inspecting module according to claim 2, wherein the variable lens is disposed outside of an area interfering with the ink jet head.

5. The inspecting module according to claim 4, wherein the area interfering with the ink jet head is under the ink jet head of which the ink is ejected.

6. The inspecting module according to claim 5, further comprising an illumination part.

7. The inspecting module according to claim 6, wherein the illumination part is white light telecentric illumination.

8. The inspecting module according to claim 6, wherein the illumination part is a RGB light source.

9. The inspecting module according to claim 8, wherein the droplet inspecting part obtains and inspects an image of the droplet per wavelength band using the RGB light source.

10. The inspecting module according to claim 9, wherein the droplet inspecting part performs the image processing by classifying according to the color of the droplet ejected from the ink jet head.

* * * * *